United States Patent
Mirov et al.

(10) Patent No.: US 6,236,666 B1
(45) Date of Patent: May 22, 2001

(54) SEMICONDUCTOR LASER WITH A SUPERBROADBAND OR MULTILINE SPECTRAL OUTPUT

(75) Inventors: Sergey B. Mirov, Birmingham, AL (US); Tasoltan T. Basiev, Moscow (RU)

(73) Assignee: UAB Research Foundation, Birmingham, AL (US)

( * ) Notice: Subject to any disclaimer, the term of this patent is extended or adjusted under 35 U.S.C. 154(b) by 0 days.

(21) Appl. No.: 09/194,031

(22) PCT Filed: May 15, 1997

(86) PCT No.: PCT/US97/08240

§ 371 Date: May 6, 1999

§ 102(e) Date: May 6, 1999

(87) PCT Pub. No.: WO97/43806

PCT Pub. Date: Nov. 20, 1997

Related U.S. Application Data

(60) Provisional application No. 60/017,443, filed on May 17, 1996.

(51) Int. Cl.$^7$ ............................................. H01S 5/14
(52) U.S. Cl. .......................... 372/23; 372/50; 372/92; 372/99; 372/101; 372/102; 372/103
(58) Field of Search .................... 372/19, 22, 23, 372/24, 44, 50, 70, 74, 92, 99, 101, 102, 103

(56) References Cited

U.S. PATENT DOCUMENTS

| | | | |
|---|---|---|---|
| H1059 | 5/1992 | Konig | 359/124 |
| 4,553,101 | 11/1985 | Mathis | 329/50 |
| 4,775,972 | 10/1988 | Ih et al. | 370/3 |
| 4,863,230 | 9/1989 | Webb | 350/96.15 |
| 4,909,584 | 3/1990 | Imoto et al. | 350/96.15 |
| 4,930,855 | 6/1990 | Clark et al. | 350/96.19 |
| 4,934,784 | 6/1990 | Kapany et al. | 350/96.18 |
| 5,005,936 | 4/1991 | Hsu | 350/96.16 |
| 5,010,346 | 4/1991 | Hamilton et al. | 341/137 |
| 5,020,049 | 5/1991 | Bodeep et al. | 370/3 |
| 5,031,188 | 7/1991 | Koch et al. | 372/50 |
| 5,153,758 | 10/1992 | Tashiro et al. | 359/124 |
| 5,351,147 | 9/1994 | Frenkel | 359/124 |
| 5,394,489 | 2/1995 | Koch | 385/14 |
| 5,396,360 | 3/1995 | Majima | 359/133 |
| 5,396,361 | 3/1995 | Sasaki et al. | 359/189 |
| 5,432,629 | 7/1995 | Shikada et al. | 359/124 |
| 5,461,635 | * 10/1995 | Basiev et al. | 372/42 |

* cited by examiner

*Primary Examiner*—James W. Davie
(74) *Attorney, Agent, or Firm*—Gifford, Krass, Groh, Sprinkle, Anderson & Citkowski, P.C.

(57) ABSTRACT

A superbroadband or multiwavelength laser transmitter source for wavelength-division multiplexing, two-wavelength interferometry, differential lidar and optical storage applications. Contrary to conventional tunable laser sources that can switch between different lasing wavelengths in a given wavelength band, the superbroadband laser simultaneously emits at multiple wavelengths. The basic idea of this system is to maintain simultaneous lasing operation in an optical active gain medium at different wavelengths. The system uses a novel dispersive cavity. By designing this cavity structure appropriately, the system creates its own microcavities each lasing at a different wavelength within the fluorescence band of the gain medium. Mode competition in the proposed cavity is absent and spectral range of simultaneous multi-frequency generation is considerably enhanced practically to the spectral width of the active media luminescence spectrum. As a result, the radiation of each mode with its own wavelength is amplified in the active media independently from the simultaneous amplification of the rest of the wavelengths.

18 Claims, 5 Drawing Sheets

_US 6,236,666 B1_

SEMICONDUCTOR LASER WITH A SUPERBROADBAND OR MULTILINE SPECTRAL OUTPUT

REFERENCE TO RELATED APPLICATION

This application corresponds to U.S. provisional application Ser. No. 60/017,443 filed May 17, 1996 and claims priority thereof, and this application expressly incorporates said provisional application Ser. No. 60/017,443 herein by reference.

BACKGROUND OF THE INVENTION

I. Field of the Invention

The present invention relates to the field of Quantum Electronics, and more particularly to the lasers that can be widely used as a powerful tool for solving problems in optical telecommunication, information coding, interferometry, optical storage, and high resolution, low coherent and time resolved imaging spectroscopy.

Primarily, the invention can be used in cases when polychromatic laser emission with a superbroadband continuum or multiline pre-assigned spectral output is required.

II. Description of the Prior Art

The ability to generate and modulate multiple wavelengths is useful for many applications in science and engineering, e.g., in differential spectroscopy and lidar and in spectroscopic and holographic implementations of optical data storage. Recent efforts in this field has focused on design of multiple wavelength transmitters for wavelength-division multiplexed (WDM) communications systems. In particular, the multichannel grating cavity (MCG) laser or the multistripe array grating integrated cavity (MAGIC) laser have been designed and developed. In this lasers several array ridges were pumped separately to generate output at different wavelengths. However, compensation for optical cross talk can be a significant design issue for these systems as well as a lack of flexibility in the selection of wavelengths or wavelength spacing. For either schemes elaborate technology of fabrication and packaging for multistripe diode array are required.

This invention relates to an alternative design using a commercial laser diode or diode array with an external cavity. By designing this cavity structure appropriately, the system creates its own microcavities each lasing at a different wavelength within the fluorescence band of the gain medium. Mode competition in the proposed cavity is absent and spectral range of simultaneous multi-frequency generation is considerably enhanced practically to the spectral width of the active media luminescence spectrum. As a result, the radiation of each mode with its own wavelength is amplified in the active media independently from the simultaneous amplification of the rest of the wavelengths. The proposed laser transmitter is suitable for implementation at any of the major spectral bands (0.8, 1.3, and 1.5 $\mu$m) and is anticipated to be operated in a single longitudinal mode.

The proposed system is based on the principles of superbroadband oscillation—realization of simultaneous lasing in the whole spectral region of active medium amplification band. Usually competition of amplification in laser active medium restricts the spectral range of simultaneous coexistence of different wavelengths of lasing. To solve this problem it is necessary to realize independent oscillations of the certain parts of the active medium with the corresponding wavelengths.

Several authors have shown the possibility of superbroadband oscillation in the pulsed dye laser, exhibiting, unfortunately, the existence of the secondary parasitic modes in the resonator, thereby decreasing the range of a broadband oscillation. In our recent papers the first solid state superbroadband and multi-frequency laser was proposed on the basis of LiF color center crystals and lasing was realized in practically the whole amplification spectral region of LiF:$F_2^-$ crystals.

The prior art is represented by the following:

- I. H. White, "A multichannel grating Cavity Laser for Wavelength Division Multiplexing Applications", IEEE J. Lightwave Technology 9, 893–899 (1991).
- K. R. Poguntke and J. B. D. Soole, "Design of a Multistripe Array Grating Integrated Cavity (MAGIC) Laser", IEEE J. Lightwave Technology, 11, 2191–2200 (1993).
- M. B. Danailov and I. P. Christov, "Amplification of Spatially dispersed ultrabroadband laser pulses", Opt. Commun., 77, 397–401 (1990).
- M. B. Danailov and I. P. Christov, "Ultrabroadband Laser Using Prizm-Based "Spatially-Dispersive" Resonator", Appl., Phys. B, 51, 300–302 (1990).
- T. T. Basiev, S. B. Mirov, _Room Temperature Tunable Color Center Lasers,_ Laser Science and Technology books series vol. 16 pp. 1–160. Gordon and Breach Science Publishers/Harwood Academic Publishers, 1994.
- T. T. Basiev, S. B. Mirov, P. G. Zverev, I. V. Kuznetsov, R. Sh. Teedeev, "Solid State Laser with Superbroadband or Control Generation Spectrum" Ser. No. 08/042, 217; filed Apr. 2, 1993, US patent pending.
- T. T. Basiev, P. G. Zverev, S. B. Mirov, "Superbroad-Band Laser on LiF Color Center Crystal for Near—Infrared and Visible Spectral Regions", _Abstr. Rep. International Conf. "LASER-93"_, Munich, Germany, 1993.
- T. T. Basiev, P. G. Zverev, S. B. Mirov, V. F. Federov, "Solid State Laser with Superbroadband or Control Generation Spectrum" SPIE, vol. 2379, 54–61, 1995.
- T. T. Basiev, P. G. Zverev, V. V. Fedorov, S. B. Mirov, "Multline, superbroadband and sun-color oscillation of a LiF:$F_2^-$ color-center laser", Applied Optics 36, 2515–2522 (1997).

SUMMARY OF THE INVENTION

The object of the present invention is to provide a semiconductor laser transmitter which is capable of lasing in multiple wavelength or superbroadband regimes of operation.

These and other objects are achieved by application of a novel external cavity for individual diode or laser diode array, wherein system creates its own microcavities each lasing at a different wavelength within the fluorescence band of the semiconductor gain medium.

According to this invention, the emission from the whole pumped volume of the diode passes through the focusing means into the aperture, which separates from the amplified emission only a part of it, that is spread parallel to the resonator axis and suppresses all the off-axis modes of radiation. The transmitted emission is retroreflected by the grating and is repeatedly directed through the gain medium through the indicated paths. As a result the radiation of every assigned wavelength is amplified without any mode competition and independently. The output radiation of the diode consists of the continuous number of beams which pass in the semiconductor crystal parallel to each other and to the laser cavity optical axis. Each of them has a certain angle incident to diffraction grating and, consequently, a distinct oscillating wavelength which is determined by a standard equation for diffraction grating working in the autocollimation regime: $\lambda=2t\ sin\theta$, where "t" is the grating spacing and "$\theta$" is the incident angle. There is no interaction between these beams and it is possible to state that each part of the crystal parallel to the laser axis works as an independent laser with its own oscillating wavelength.

BRIEF DESCRIPTION OF THE DRAWINGS

The herein described advantages and features of the present invention, as well as others which will become apparent, are attained and can be understood in more detail by reference to the following description and appended drawings, which form a part of this specification.

It is to be noted, however, that the appended drawings illustrate only exemplary embodiments of the invention and are therefore not to be considered limiting of its scope, for the invention may admit to other equally effective embodiments.

DETAILED DESCRIPTION OF THE PEFERRED EMBODIMENTS

Figure 1:
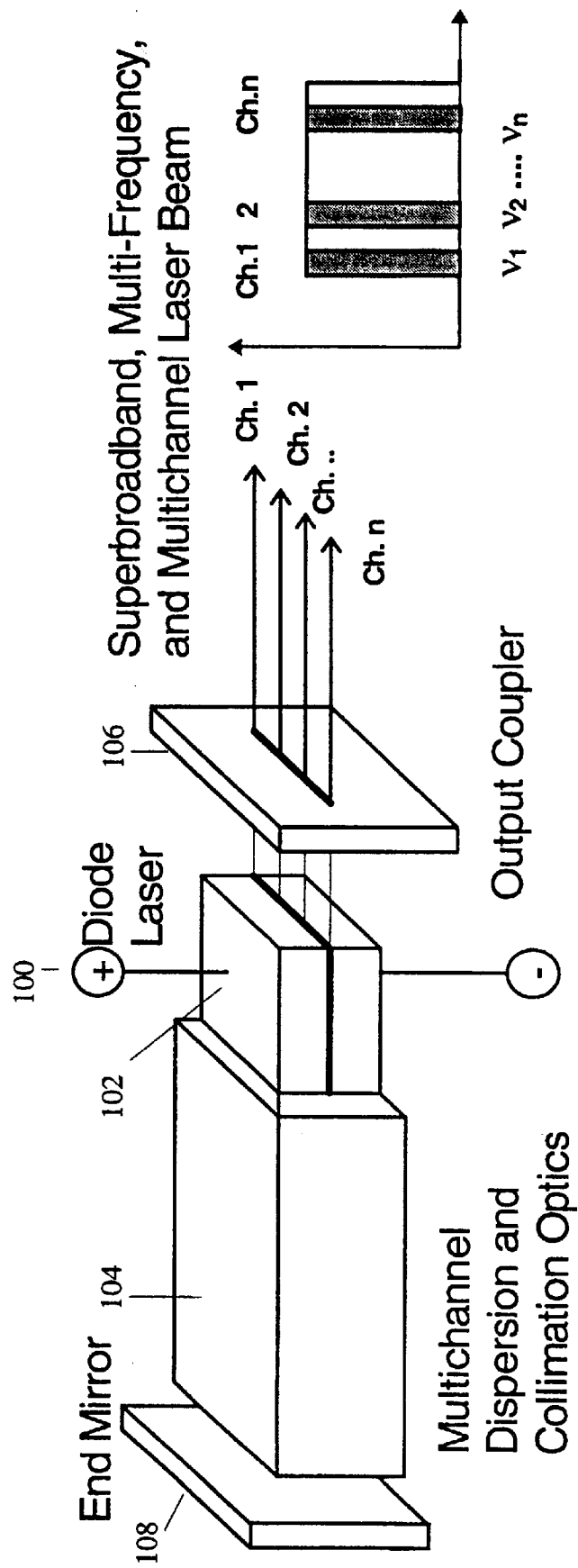
FIG. 1 is a block-scheme of an embodiment of a semiconductor laser with a superbroadband or multiline spectral output.

FIG. 1 is a block-scheme of an embodiment of a semiconductor laser 100 with a superbroadband or multiline spectral output. Superbroadband or multiline semiconductor laser 100 includes the following components: electrically or laser pumped diode or diode array 102 operating at any of the major spectral bands (0.8, 1.3, and 1.5 $\mu$m), multichannel dispersion and collimation optics 104, and output 106 and rear couplers 108.

Emission from the whole pumped volume of the diode 102 passes through the multichannel dispersion and collimation optics 104 that directs the spontaneous emission of the diode into the off-axis mode suppression element, which separates from the amplified emission only part of it, that is spread parallel to the resonator axis. This separated radiation is diffracted on the dispersive element (which is a part of the multichannel dispersion and collimation optics means as well as the off-axis mode suppression element) and then is retroreflected by the rear coupler 108 back to multichannel dispersion and collimation optics system. The off-axis mode suppression element, of the system again extracts from the diffracted radiation only the radiation of the main laser modes and secondary laser modes, which diverge from the optical axes are expelled from the process of generation. The radiations of the main laser modes, each with a distinct wavelength, are directed back to the active medium. Each mode with its different wavelength has its own trajectory. This radiation along with the stimulated radiation provoked by it are retroreflected by the output coupler 106. This process gives rise to the superbroadband multi-frequency oscillation—independent oscillation of the different parts of active medium with different wavelengths (covering practically the whole spectral region of the active medium amplification band) and the same output direction. The multichannel dispersion and collimation optics means may additionally contain a spatial filtering element (periodic mask or acousto-optic filter) that will provide an opportunity of rapid switching of the spectral profile of the beam from superbroadband continuum to a pre-assigned spectral composition.

The modulation of output radiation can be provided independently for each spectral channel by the methods of intra- or out of-cavity acousto- and electro-optic modulation, or by the methods of high-frequency pump current modulation for each laser diode in a bar or array.

Figure 2:
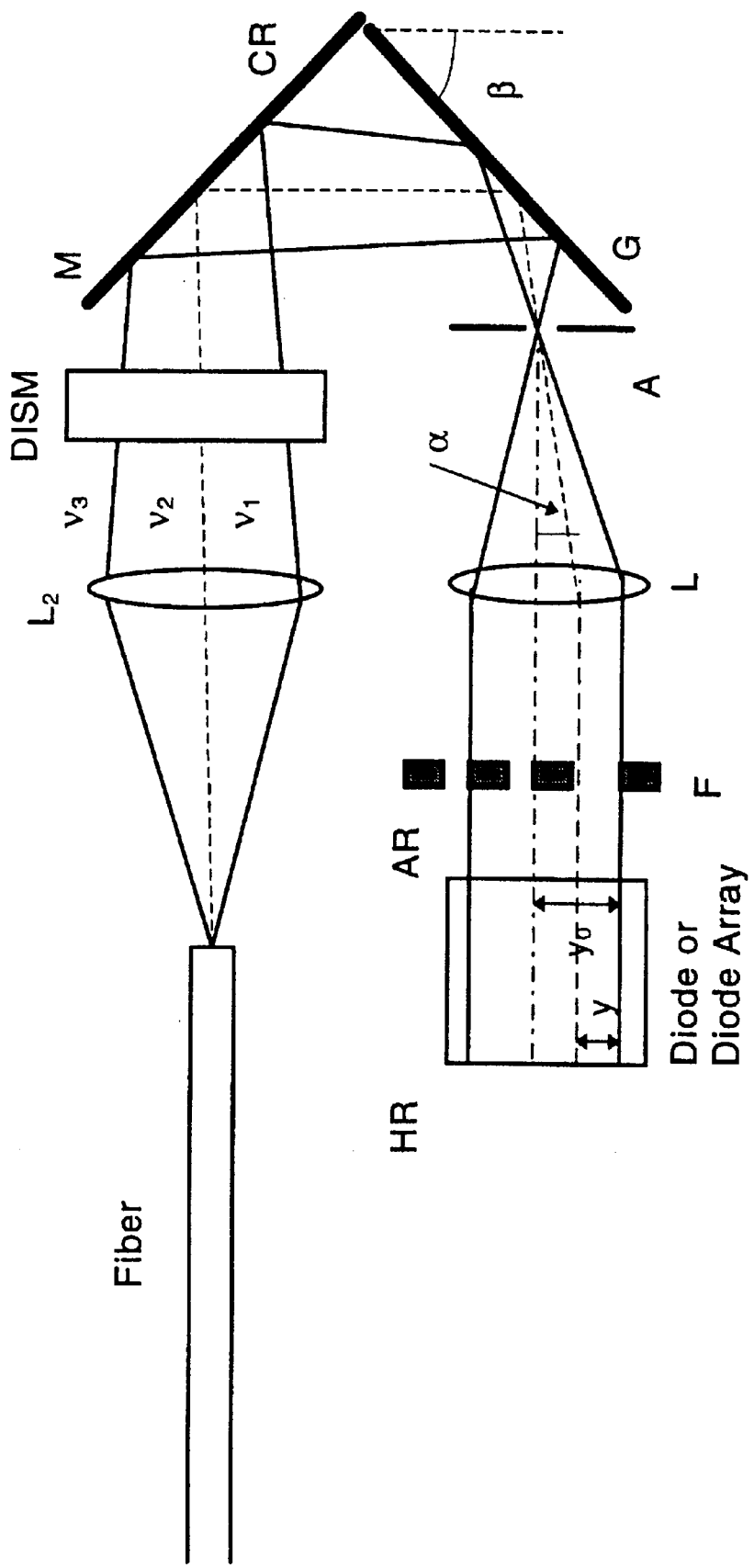
FIG. 2 illustrates an example of particular external cavity design with a spherical focusing element.

Referring to FIG. 2 that illustrates an example of particular external cavity design with a spherical focusing element the laser operates as follows:

Active medium, which is a single diode or diode array is electrically pumped or pumped by the radiation of another laser. The diode has a reflectivity coating (HR) on the rear facet and an antireflection (AR) coating reflectivity on the front facet. Emission from the whole pumped volume of the active medium passes through the focusing element (L) into the off-axis mode suppression element (A), which separates from the amplified emission only part of it, that is spread parallel to the resonator axis. This separated radiation is diffracted on the grating (G). The grating works as an output coupler in the auto-collimating regime in the first order of diffraction and retroreflects radiation to the suppression element (A). The off-axis mode suppression element, in turn extracts from the diffracted radiation only the radiation of the main laser modes and secondary laser modes, which diverge from the optical axes, and are expelled from the process of generation. The radiation of the main laser modes, each with a distinct wavelength, is collimated by the focusing element (L) and directed back to the active medium. Each mode with its different wavelength has its own trajectory. This radiation along with the stimulated radiation provoked by it are retroreflected by the mirror (HR) on the rear facet of the diode. This process gives rise to the superbroadband multi-frequency oscillation—independent oscillation of the different parts of active medium with different wavelengths (covering practically the whole spectral region of the active medium amplification band) and the same output direction. The output radiation of the superbroadband diode laser consists of the continuous number of beams which pass in the active zone of semiconductor crystal parallel to each other and to the laser cavity optical axis. Each of them has a certain angle incident to diffraction grating and, consequently, a distinct oscillating wavelength which is determined by a standard equation for diffraction grating working in the autocollimation regime: $\lambda=2t\ sin\theta$, where "t" is the grating spacing and "$\theta$" is the incident angle (on FIG. 2 $\theta=\alpha+\beta$). There is no interaction between these beams and it is possible to state that each part of the crystal parallel to the laser axis works as an independent laser with its own oscillating wavelength. The diffraction grating works as an output coupler, so that the zero order of diffraction is extracted out of the cavity. The overall output radiation has a spatially spread "rainbow" spectra divergent in the grating dispersion plane, so that each narrow line laser mode has its own angular direction in the output radiation. The output radiation is reflected by the mirror (M) (forming a corner reflector (CR) with the grating) to data input and signal modulation system (DISM) and then focused by the focusing system $L_2$ into the fiber. A mask (filtering mask "F") or image controller installation into the cavity will result in the multifrequency laser oscillation output with the special wavelength distribution or spectral coding.

Figure 3:
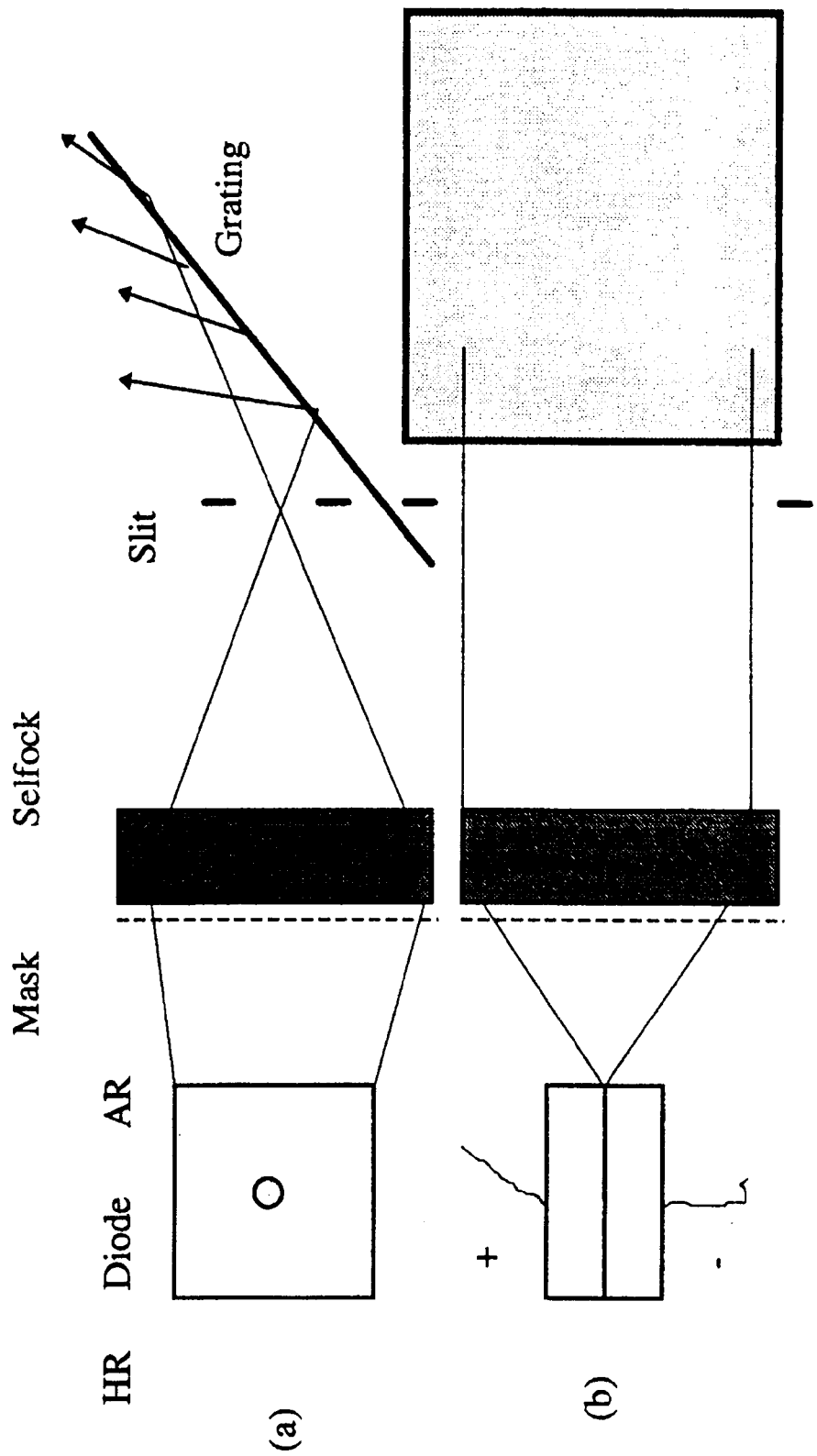
FIG. 3 illustrates another example of particular external cavity design with a "selfock" (gradient index imaging lens) intracavity microoptical focusing element: (a) a top view of the system; (b) a side view of the system.

It is another object of the present invention to provide a semiconductor superbroadband and/or multiline laser with various configurations of the external cavities based on the micro-optic focusing (cylindrical, spherical, "selfok"—gradient index imaging lenses) and dispersion elements using effects of interference, refraction and diffraction will be used as well. An example of the particular external cavity design for the superbroadband semiconductor with a "selfock" (graded-index lens) intracavity micro-optical focusing element is demonstrated in FIG. 3.

The problem is to collimate the radiation in the vertical plane, featuring the dimension of the laser element of about 1 μm and the maximum divergence of about 50°, and to create some dozens of parallel, spectrally and spatially independent channels in the horizontal plane with much bigger dimension "L" of the active zone of the semiconductor crystal. The length L for a single diode laser element is about 5–100 μm and for a laser bar or array—$2 \times 10^2 – 10^4$ μm.

It is further object of the present invention to provide the optical schemes of the superbroadband multi-frequency semiconductor lasers comprising planar waveguide and distributed feedback optical elements.

It is still a further object of the invention to provide the optimal conditions for refraction, interference and diffraction at optical elements of external cavity and active element to achieve the highest number of parallel spectral channels with the minimum spectral width of each of them. Besides, the intracavity losses must be decreased to a minimum as well as the interaction (crosstalk) of different spectral channels should be suppressed.

It is an additional further object of the present invention to provide a superbroadband semiconductor laser with a further extension of the spectral output by means of arranging of gradients of (a) composition, (b) impurity concentration in the semiconductor material, (c) temperature, and (d) pressure directed along the linear dimension of the emitting diode.

SPECTRAL RESOLUTION OF SUPERBROADBAND LASER IN A MULTILINE OUTPUT MODE

Let's consider that each beam passing through the active zone of the diode is located at a coordinate "y" in the transversal direction, while "$y_o$" corresponds to the position of the optical axis of the laser, "$y_o$" is the angle of intersection of the current beam "y" and the optical axis and "f" is the focal length of the focusing element $L_2$. Then we can write:

$$\alpha = \arctan \frac{y_0 - y}{f}. \tag{1}$$

If the normal to diffraction grating (G) forms the angle "β" to the optical axis then one can say that each beam "y" arrives at the diffraction grating at the certain angle determined as "β30 α. The diffraction grating works in the auto-collimation scheme causing the first order of diffraction to be reflected back into the cavity. Since each beam strikes the diffraction grating at a different angle the cavity for each beam has high selectivity for the certain wavelength, determined as $$k\lambda = 2t \sin (\beta + \alpha) \tag{2}$$

where "k" is the order of reflection (in our particular case k=1), and "t" is the grating spacing. The zero order of diffraction is used as an output of the laser.

The spectral resolution of the laser, that is the possibility of oscillating a certain separate beam with its own wavelength without interfering with another, is determined by the spectral resolution of the cavity. This can be estimated by the angular selectivity of the scheme, determined as h/f, where "h" is the size of the aperture. This means that:

$$\Delta\alpha = \frac{h}{f}, \tag{3}$$

and taking into account the diffraction grating equation (2) this gives $$\Delta\lambda = 2t \cdot \frac{h}{f} \cdot \cos(\beta + \alpha). \tag{4}$$

So the spectral resolution is determined by the size of the intracavity aperture "h".

In order to obtain high laser conversion efficiency and high spectral resolution it is necessary to choose the size of the aperture that allows one to work in a single transversal mode regime but with low diffraction losses. This means that one needs to make the Fresnel number for each laser ≈1, that is:

$$F = \frac{h^2}{L \cdot \lambda} \approx 1, \tag{5}$$

where "L" is the length of the cavity. In this case the diffraction losses of the scheme are not so large, while the spectral resolution is still high.

Substituting the data of the diode laser in equation (5)— the length of the resonator L=10 cm, the focal length f=4 cm of the intracavity focusing element L, the grating spacing t=1/1200 mm=833 nm, and the maximum of the diode amplification band λ=1.55 μm—one can obtain for the single transversal mode oscillation that the size "h" of the aperture "A" must be less than 0.39 mm. The spectral resolution in this case (when the angle of incidence β+α~85°) will be about 1.4 nm. Further reduction of the size of the aperture results in increased spectral resolution and a corresponding growth of the diffraction losses. A lower limit to the useful width of the slit is about 20 μm. The narrowest linewidths in this situation will be about 0.07 nm.

In other words, our laser can combine simultaneously approximately 35–700 independent conventional narrowband lasers (or any smaller quantity of lasers, for example 1–10, forming any pre-assigned spectral composition), generating synchronously (without any rotation of the grating) narrowband oscillation with different frequencies, covering continuously the whole spectral range of the diode emission band. The quantity of these simultaneously generated spectrally narrow lines can be approximately defined as the width of the active medium fluorescence band (usually 50 nm for diodes emitting at 1.55 μm) over the single line width (0.07–1.4 nm).

EXPERIMENTAL RESULTS

We believe that the superbroadband or multifrequency color center laser is a good object for the multifrequency semiconductor laser modeling. So, we demonstrate a feasibility of the proposed invention on the basis of the superbroadband and multiline $LiF:F_2^-$ color center laser[5-9]. The reason why we believe that the superbroadband or multifrequency color center laser is a good object for the multifrequency semiconductor laser modeling is as follows:

First of all, color center crystals feature similarity with semiconductor active media in the value of the gain per pass. Color center crystals have an extremely high for solid state media gain per pass (in cm scale), which is of the same order of magnitude as the gain per pass of the semiconductor lasers (in mm scale).

Secondly, color center crystals demonstrate a very wide emission bands. They are ten times wider than the emission bands of semiconductor active media, but the ratio of the spectral widths in the superbroadband multi-frequency and single line regimes of oscillations (quantity of independent lasing channels) could be of the same order of magnitude, too.

Finally, a planar geometry of optical pumping proposed and realized for the color center laser provides a good similarity to traditional in plane emitting diode lasers.

Figure 4:
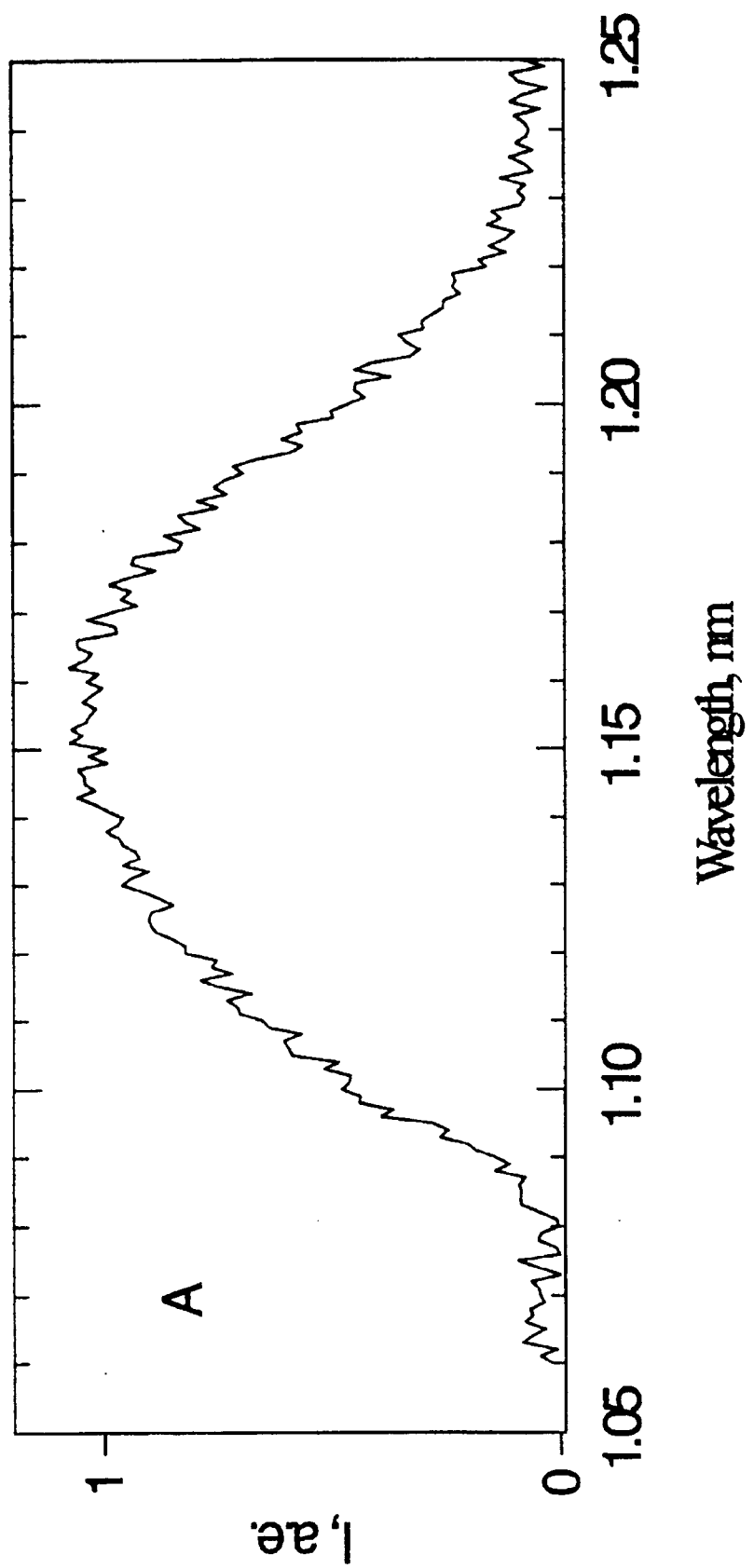
FIG. 4 illustrates the superbroadband spectral output of the LiF:$F_2^-$ laser with a similar to the above mentioned external cavity design.
Figure 5:
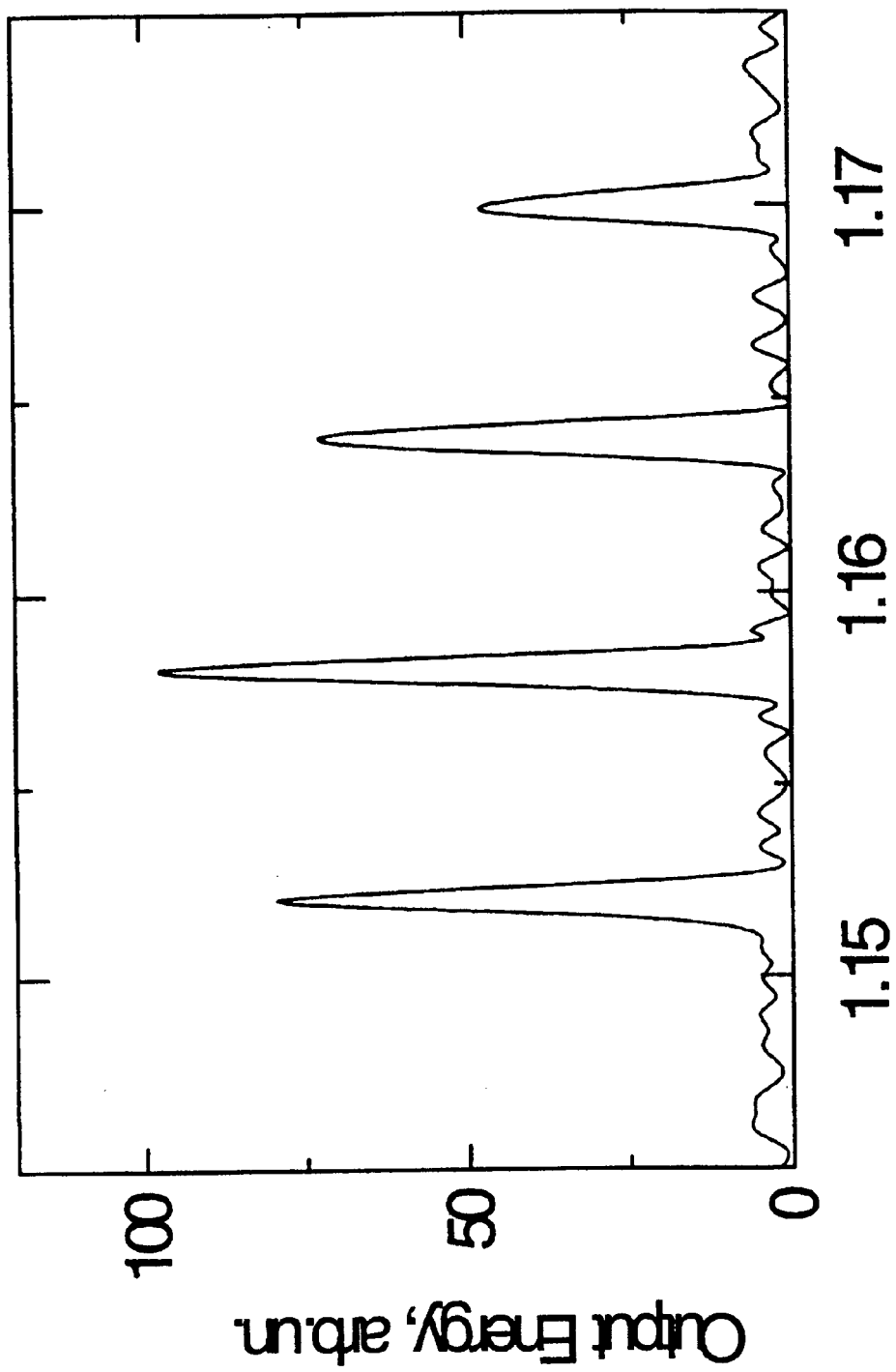
FIG. 5 illustrates a fragment of the LiF:$F_2^-$ color center laser multifrequency spectral output formed due to spatial filtering element, having a periodic structure and installed into the pumping beam.

The wide beam of the pump neodymium laser longitudinally excites color centers through the input dichroic mirror in the large part of the LiF active element. For pumping, the radiation of the first harmonic of nanosecond YAG:Nd laser with smooth spatial intensity profile was used. Pulse energy was about 25 mJ. Superbroadband lasing of $F_2^-$ CCs at the spectral range 1.1–1.24 $\mu$m with the efficiency 10–15% was realized in a scheme similar to presented in FIG. 2. FIG. 4 shows one of the superbroadband spectra obtained in this experiment. Laser spectrum of each pulse was measured with a polichromator and an optical multichannel analyzer. The changes of laser energy versus wavelength are connected with the spatial distribution of the pump laser beam. A special mask (filtering mask "F") or image controller installation into the pump beam, or in the cavity results in the multifrequency laser oscillation output with the special wavelength distribution or spectral coding (FIG. 5). FIG. 5 representing multi-frequency $LiF:F_2^-$ laser generation with spectral coding, demonstrate the possibility of rapid switching of the spectral profile of the beam from superbroadband continuum to a pre-assigned spectral composition.

These results indicate that there is a significant potential for application this new type of superbroadband or control multi-frequency spectrum generation laser scheme for signal multiplexing or information coding.

What is claimed is:

1. A diode laser or array having a superbroadband or simultaneous multiple wavelength spectral output when pumped electrically, optically or by means of electron beam, the diode laser or array comprising semiconductor medium and including different gain regions each associated with a spectral component of a desired wavelength and producing emission radiation which may include secondary off-axis laser modes; dispersion means for dispersing the emission radiation and causing multiple passes of the spectral components through the associated gain regions of said active medium and providing an output of desired spectral components; and suppression means for suppressing off-axis laser modes to avoid mode competition thereby maximizing the amplification of the desired spectral components.

2. Laser, according to claim 1, wherein said dispersive means comprises a focusing element and a diffraction grating.

3. Laser, according to claim 2, wherein said diffraction grating forms part of a corner reflector which includes a high reflecting mirror.

4. Laser, according to claim 2, wherein said focusing element and diffraction grating are monolithically integrated in a planar waveguide structure.

5. Laser, according to claim 2, wherein said diffractions grating is a distributed feedback grating.

6. Laser, according to claim 2, wherein said focusing element comprises a convex lens.

7. Laser, according to claim 2, wherein said focusing element comprises graded-index (GRIN) lens.

8. Laser, according to claim 2, wherein said focusing element comprises a cylindrical lens.

9. Laser, according to claim 2, wherein said dispersion means includes a focusing element having a focal point at which emission radiation is focused and said suppression means comprises an optical blocking element which at least partially blocks the emission radiation to thereby suppress the secondary off-axis laser modes.

10. Laser, according to claim 9, wherein said optical blocking element comprises a slit aperture.

11. Laser, according to claim 1, wherein said active medium comprises a semiconductor crystal emitting in one of the major spectral bands 0.8, 1.3 and 1.5 $\mu$m.

12. Laser, according to claim 1, further comprising filtering means for limiting the spectral components that are transmitted through the active medium to those components having desired wavelengths.

13. Laser, according to claim 12, wherein said filtering means is positioned between said active medium and said dispersion means.

14. Laser, according to claim 12, wherein said filtering means are fabricated photolitographically as a multistripe mask on the semiconductor structure.

15. Laser, according to claim 1, wherein for further extension of the range of superbroadband or multiwavelength spectral output semiconductor medium has a gradient of composition along the direction perpendicular to the linear dimension of the emitting diode.

16. Laser, according to claim 1, wherein for further extension of the range of superbroadband or multiwavelength spectral output semiconductor medium has a gradient of impurity concentration along the direction perpendicular to the linear dimension of the emitting diode.

17. Laser, according to claim 1, wherein for further extension of the range of superbroadband or multiwavelength spectral output semiconductor medium has a gradient of temperature along the direction perpendicular to the linear dimension of the emitting diode.

18. Laser, according to claim 1, wherein for further extension of the of the range of superbroadband or multiwavelength spectral output semiconductor medium has a gradient of pressure along the direction perpendicular to the linear dimension of the emitting diode.

* * * * *